(12) United States Patent
Mori

(10) Patent No.: US 8,466,734 B2
(45) Date of Patent: Jun. 18, 2013

(54) GATE DRIVING CIRCUIT FOR POWER SEMICONDUCTOR ELEMENT

(75) Inventor: Takahiro Mori, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 13/183,991

(22) Filed: Jul. 15, 2011

(65) Prior Publication Data

US 2012/0013370 A1    Jan. 19, 2012

(30) Foreign Application Priority Data

Jul. 15, 2010    (JP) .................................. 2010-160888

(51) Int. Cl.
*H03K 17/30* (2006.01)

(52) U.S. Cl.
USPC .......... 327/381; 327/384; 327/108; 361/93.1; 361/87; 361/101

(58) Field of Classification Search
USPC .......... 327/108, 381, 384, 403, 404; 323/274, 323/275, 276, 277, 278, 284; 361/86, 87, 361/101, 91.1, 93.1; 363/50
See application file for complete search history.

(56) References Cited

U.S. PATENT DOCUMENTS

| | | | | |
|---|---|---|---|---|
| 5,396,117 A | * | 3/1995 | Housen et al. | 327/480 |
| 5,898,554 A | * | 4/1999 | Schnetzka et al. | 361/18 |
| 6,717,785 B2 | * | 4/2004 | Fukuda et al. | 361/93.1 |
| 7,586,726 B2 | * | 9/2009 | Maebara et al. | 361/93.8 |
| 7,675,727 B2 | * | 3/2010 | Sasaki et al. | 361/93.1 |
| 7,746,614 B2 | * | 6/2010 | Ishikawa et al. | 361/93.1 |

FOREIGN PATENT DOCUMENTS

| | | |
|---|---|---|
| JP | 2001-314075 A | 11/2001 |
| JP | 2002-119044 A | 4/2002 |
| JP | 2003-134797 A | 5/2003 |
| JP | 2008-118767 A | 5/2008 |

* cited by examiner

*Primary Examiner* — Lincoln Donovan
*Assistant Examiner* — Jung H Kim
(74) *Attorney, Agent, or Firm* — Rossi, Kimms & McDowell LLP

(57) ABSTRACT

A gate driving circuit for driving a power semiconductor element can include a MSINK that is an n-channel metal-oxide silicon field-effect transistor (MOSFET) with a low resistance value for rapidly drawing out the charges accumulated on the gate of an insulated gate bipolar transistor (IGBT), and a MSOFT that is an n-channel MOSFET with a high resistance value for slowly drawing out the charges. By shifting the time for turning ON of these MOSFETs, soft interruption can be performed rapidly and surely when overcurrent or short circuit current flows in the IGBT. Therefore, device breakdown is minimized or avoided and noise generation is suppressed.

7 Claims, 12 Drawing Sheets

GATE DRIVING CIRCUIT FOR POWER SEMICONDUCTOR ELEMENT

BACKGROUND OF THE INVENTION

1. Field of the Invention

Embodiments of the invention relate to a gate driving circuit for a power semiconductor element, and, in particular, to a gate driving circuit implementing an overcurrent protection circuit and a short circuit protection circuit.

2. Description of the Related Art

An intelligent power module (hereinafter referred to as an "IPM") is known as a semiconductor device used in a power conversion apparatus such as an inverter or a chopper. An IPM includes a plurality of semiconductor chips such as IGBT chips, and a driving circuit and a protection circuit therefor contained in a single package.

FIG. 9 is a circuit diagram of a conventional gate driving circuit 700 for an IGBT. The gate driving circuit is the part encircled by the dotted lines. A collector 1a of the IGBT 1 is connected to a main power supply not depicted in the figure. An emitter 1b of the IGBT 1 is connected to the GND, and a sense emitter is connected to the GND through a sense resistor 12. The symbol $I_E$ represents a main current running through the emitter 1b. The symbol VOS is a voltage generated at the time when a sense current Is flows through the sense resistor 12 to the GND, the sense current Is being proportional to and smaller than the main current Ic. The collector current Ic is divided into the emitter circuit $I_E$ and the sense current Is. The symbol VG represents a gate voltage of the IGBT 1.

An overcurrent detection circuit 4 is a comparator that compares the voltage VOS with an overcurrent protection threshold value VOC. The overcurrent detection circuit 4 outputs a signal when the voltage VOS exceeds the overcurrent protection threshold value VOC.

A delay circuit 5 is provided for the purpose of avoiding an undesirable effect of momentary operation of the overcurrent detection circuit 4 due to a noise or the like. The delay circuit 5 operates receiving an output from the overcurrent detection circuit 4 and delivers an output signal after a predetermined delay time. The output signal from the delay circuit is continuously delivered until the IGBT 1 completely becomes an OFF state. The output signal from the delay circuit 5 is inputted to a pre-driving circuit 11.

A MSOURCE 9, a p-channel MOSFET, has a gate 9c connected to the pre-driving circuit 11, a source 9b connected to a control power supply 14 (Vcc) for the gate driving circuit, and a drain 9a connected to a gate 1d of the IGBT 1. The MSOURCE 9, upon receiving an ON signal for the IGBT 1 from the pre-driving circuit 11, turns ON to make the IGBT 1 turn ON.

A MHOLD 10, an n-channel MOSFET, has a gate 10c connected to the predriving circuit 11, a source 10b connected to the GND, and a drain 10a connected to the gate 1d of the IGBT 1. The MHOLD 10, upon receiving an OFF signal for the IGBT 1 from the predriving circuit 11, turns ON to make the IGBT 1 turn OFF. At this moment, the MSOURCE 9 turns into an OFF state.

An OFF signal for the IGBT 1 is delivered in a normal OFF operation, in which any signal indicating an abnormality such as overcurrent does not exist. In addition, an OFF signal for the IGBT 1 is also delivered from the predriving circuit 11 when an abnormality such as overcurrent is detected by the overcurrent detection circuit 4 and an output signal is delivered from the delay circuit 5.

FIG. 10 shows operation waveforms in the gate driving circuit 700 shown in FIG. 9. When an output signal from the overcurrent detection circuit 4 is delivered through the delay circuit 5 to the predriving circuit 11 and an overcurrent state is identified, the MSOURCE 9 is turned OFF and the MHOLD 10 is turned ON. Electric charges accumulated on the gate 1d of the IGBT 1 are rapidly drawn out through the MHOLD 10 with a small ON resistance. As a result, the gate voltage VG rapidly decreases and the collector current $I_C$ rapidly decreases as well, causing hard interruption of the IGBT 1. The hard interruption of the IGBT 1 makes noises and thus, undesirable. A means for soft interruption of the IGBAT 1 is described in the following.

FIG. 11 is a circuit diagram of a conventional gate driving circuit 800 for soft interruption. The gate driving circuit 800 is different from the circuit of FIG. 9 in that a MSOFT 7, an n-channel MOSFET, is inserted between the gate 1d of the IGBT 1 and the GND. The ON resistance of the MSOFT 7 is selected to be larger than that of the MHOLD 10, which is an n-channel MOSFET. The output signal from the delay circuit 5 is delivered to the additionally provided MSOFT 7.

FIG. 12 shows operation waveforms in the gate driving circuit 800 of FIG. 11. Operation of the gate driving circuit 800 is described in the following with reference to FIG. 12. When a signal at the GND potential level is outputted from the predriving circuit 11, the MSOURCE 9 turns ON and a positive voltage is applied to the gate 1d of the IGBT 1. The IGBT 1 turns ON at the moment when the gate voltage VG reaches the gate threshold voltage VGtho. Upon turning ON of the IGBT 1, the collector circuit Ic starts to flow. The gate voltage VG becomes constant when the voltage VG reaches the gate threshold voltage VGtho. After certain period of the constant voltage, the gate voltage VG increases again until reaching the control power supply voltage Vcc and stays at that value thereafter. An emitter current $I_E$ flows through the emitter 1b of the IGBT 1 and a sense current Is flows through the sense emitter 1c. This sense current Is flows to the GND through the sense resistor 12. The voltage VOS arises in the sense resistor 12 with the sense current Is. The sense current Is is proportional to the collector current Ic and has a current magnitude in a range from 1/(several tens of thousands) to 1/(several hundred).

When the VOS reaches the VOC, the judgment is made that the emitter current $I_E$ have reached a level of overcurrent and an output signal is delivered from the overcurrent detection circuit 4 to the delay circuit 5 to operate the delay circuit 5.

After a predetermined period of time OCdelay from start of operation of the delay circuit 5, an output signal is outputted from the delay circuit 5. During the period to the time at which the output signal is outputted, the collector current $I_C$ continues to increase. When the output signal is outputted from the delay circuit 5, the MSOFT 7 turns ON. In the MSOFT 7, the total current flows consisting of a current from the high potential side 14 of the control power supply through the MSOURCE 9 and a current of charges being drawn out from the gate 1d of the IGBT 1 on which the charges have been accumulated. Since the ON resistance is large in the MSOFT 7, the gate voltage VG decreases slowly until reaching the VGtho. At the moment when the gate voltage VG reaches the VGtho, the collector current Ic turns to a decreasing process. Since the gate voltage VG decreases slowly, the collector current Ic also decreases slowly (soft interruption). Therefore, the oscillation superimposed on the waveform between collector and emitter is mitigated, suppressing noise generation.

Afterwards, the MHOLD 10 turns ON receiving a signal from the predriving circuit 11, thereby turning the IGBT 1 OFF completely.

Japanese Unexamined Patent Application Publication No. 2003-134797 (also referred to herein as "Patent Document 1") discloses a gate driving circuit for avoiding generation of high surge voltage in the process of interruption of a power device upon detection of an abnormality. The circuit operates as described below. An OR circuit receives an output from an overcurrent detection circuit for detecting an overcurrent and an output from an abnormality detection circuit for detecting an overheating, an insufficient voltage, or the like. When an abnormality is detected in the overcurrent detection circuit or the abnormality detection circuit, two MOSFETs of a first MOSFET and a second MOSFET are controlled to decrease the gate voltage Vg of the IGBT. In this condition, a third MOSFET for ON control of the IGBT is changed to an interrupted state to interrupt the IGBT. After that, a fourth MOSFET for OFF control of the IGBT is changed to a conductive state. Owing to this means, the IGBT is softly interrupted not only in the event of overcurrent generation, but also on detection of any abnormality, and thus, surely avoiding generation of high surge voltage.

Japanese Unexamined Patent Application Publication No. 2001-314075, (also referred to herein as "Patent Document 2") discloses a means for avoiding increase in turn off loss despite variation of component characteristics of power semiconductor elements. This means is described below. A comparator circuit detects that a gate-emitter voltage Vge of a power semiconductor element has reached a certain threshold value. The output from the comparator circuit and an output from a delay circuit are inputted to an AND circuit. The output from the AND circuit is delivered to a DFF (a D-type flip-flop). An output of a one-shot circuit for triggering rise up of the delay circuit is delivered to the clock side of the DFF. If the signal output time from the AND circuit is longer than a normal signal output time of the one-shot circuit due to variation of characteristics, the output from the DFF is set to be a high level to turn a fourth switch ON, thereby decreasing the gate resistance and attaining fast turn OFF operation.

Japanese Unexamined Patent Application Publication No. 2002-119044 (also referred to herein as "Patent Document 3") discloses a means for avoiding increase in a turn off loss even in a high temperature condition by varying a resistance value of combined two resistances provided between a gate and emitter of the IGBT.

Japanese Unexamined Patent Application Publication No. 2008-118767 (also referred to herein as "Patent Document 4") discloses a means for performing current limitation of an IGBT precisely and stably despite variation in characteristics of component elements. This means is described below. Emitter current of the IGBT is shunted and inputted to a comparator, which detects a sense voltage and compares the sense voltage is with a reference voltage Vref. If the sense voltage is larger than the reference voltage Vref, an MOSFET is turned ON by the comparator and charges at the gate of the IGBT are drawn out while making the sink side current I1 constant by a constant current source, thus limiting the main current of the IGBT.

The conventional gate driving circuit 800 shown in FIG. 11, however, needs a long time until turning to a decreasing process after judgment of overcurrent in the collector current Ic. Comparison between FIG. 10 and FIG. 12 demonstrates that the time period until turning to a decreasing process after judgment of overcurrent in the collector current Ic is longer in the gate driving circuit 800 of FIG. 11. A heavy overcurrent is flowing at the moment of interruption of the IGBT 1 in this example and overcurrent breakdown of the element often occurs. In the case of load short circuit or large gate capacitance of the IGBT in this construction, a long time is necessary to draw out the charges on the gate due to the effect of a mirror capacitance. During that period, over current or short circuit current continues to flow in the IGBT 1, resulting in breakdown of the element.

Patent Document 1, although discloses a means for avoiding generation of high surges (noises) by providing with a MSOFT (MOSFET 14) and a MSINK (MOSFET 15), does not mention about a means in which the gate voltage of the IGBT is monitored and the MSINK is separated to perform soft interruption of the IGBT.

In the circuits of Patent Documents 2 through 4, a gate potential monitoring circuit is provided for monitoring the gate voltage of the IGBT and, during continued ON state of the IGBT, the MOSFET (MSINK) for fast decreasing of the gate voltage is separated. And the MOSFET (MSOFT) is operated for slowly decreasing the gate voltage. Thus, soft interruption of the IGBT is performed and device breakdown due to overcurrent or short circuit is avoided. However, the documents are silent about a gate driving circuit for suppressing accompanied noise generation.

SUMMARY OF THE INVENTION

It is therefore an object of the present invention to solve the problems and provide a gate driving circuit for a power semiconductor element that quickly and surely performs soft interruption of the element in the event of overcurrent and short circuit, thereby avoiding device breakdown and suppressing noise generation.

In order to attain the above object, a gate driving circuit for a power semiconductor element according to the invention as stated in claim 1, comprises: a sense resistor in which a sense current proportional to a main current in a switching element flows; an overcurrent detection circuit and a short circuit detection circuit, the both receiving a sense voltage generated in the sense resistor; a gate voltage monitoring circuit that receives a gate voltage of the switching element; a delay circuit that receives an output signal from the overcurrent detection circuit; a logic circuit that receives output signals of the overcurrent detection circuit, of the short circuit detection circuit, and of the gate voltage monitoring circuit; a first semiconductor element that receives an output signal from the delay circuit; a second semiconductor element that receives an output signal from the logic circuit; a predriving circuit that receives an output signal from the delay circuit and drives the switching element; and an output stage circuit that receives an output signal from the predriving circuit and deliver a gate signal to the switching element;

A gate driving circuit for a power semiconductor element according to the invention as stated in claim 2 is the gate driving circuit according to the invention as stated in claim 1, wherein the first semiconductor element is an n-channel first MOSFET, and the second semiconductor element is an n-channel second MOSFET having an ON resistance smaller than that of the first semiconductor element.

A gate driving circuit for a power semiconductor element according to the invention as stated in claim 3 is the gate driving circuit according to the invention as stated in claim 1, wherein the overcurrent detection circuit outputs a first output signal when the sense voltage exceeds a first reference voltage indicating an overcurrent level; the short circuit detection circuit outputs a second output signal when the sense voltage exceeds a second reference voltage indicating a short circuit current level; and the gate voltage monitoring circuit outputs an output signal when the gate voltage of the switching element exceeds a pseudo-threshold voltage that is higher than a gate threshold voltage.

A gate driving circuit for a power semiconductor element according to the invention as stated in claim 4 is the gate driving circuit according to the invention as stated in claim 1, wherein the gate voltage of the switching element decreases rapidly caused by turning ON of the second semiconductor element, thereby shifting a time for the main current in the switching element to turn into a decreasing process to an earlier time; and the gate voltage of the switching element decreases slowly caused by turning ON of the first semiconductor element, thereby performing soft interruption of the switching element.

A gate driving circuit for a power semiconductor element according to the invention as stated in claim 5 is the gate driving circuit according to the invention as stated in claim 1, further comprising a one-shot circuit in which an S terminal thereof is connected to an output terminal of the logic circuit, an R terminal thereof is connected to an output terminal of the gate voltage monitoring circuit, and a Q terminal thereof is connected to a gate terminal of the second semiconductor element.

A gate driving circuit for a power semiconductor element according to the invention as stated in claim 6 is the gate driving circuit according to the invention as stated in claim 5, wherein the one-shot circuit is composed of a flip-flop circuit performing a set function and a reset function.

A gate driving circuit for a power semiconductor element according to the invention as stated in claim 7 is the gate driving circuit according to the invention as stated in claim 1 or claim 5, further comprising a constant current source inserted between a drain of the second semiconductor element and a gate of the switching element.

A gate driving circuit for a power semiconductor element according to the invention as stated in claim 8 is the gate driving circuit according to the invention as stated in claim 1, further comprising a current mirror circuit in place of the second semiconductor element, the current mirror circuit being inserted between the gate terminal of the switching element and a GND terminal and comprising the second semiconductor element as a component of the current mirror circuit.

A gate driving circuit according to the present invention comprises a switching element for rapidly drawing out the charges accumulated on the gate of a power semiconductor element and a switching element for slowly drawing out the charges. By turning the switching elements ON at different times, soft interruption of the element is performed rapidly and surely on an event of overcurrent or short circuit current. Therefore, device breakdown is avoided and generation of noises is suppressed.

When a one-shot circuit is provided, the operations described above can be surely performed despite oscillation in the overcurrent and the short circuit current.

DETAILED DESCRIPTION

Figure 9:
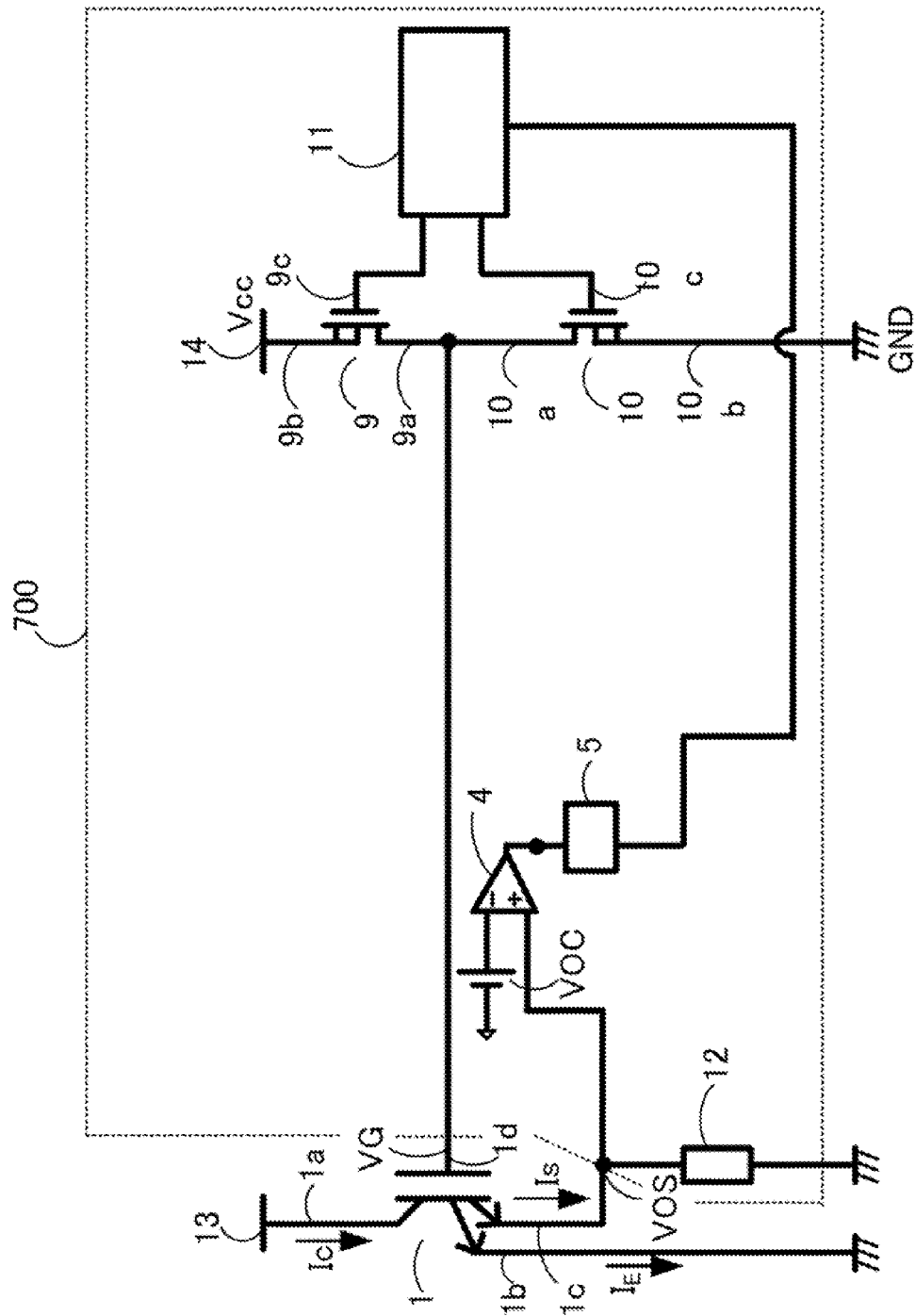
FIG. 9 is a circuit diagram showing a conventional gate driving circuit 700 for an IGBT.
Figure 10:
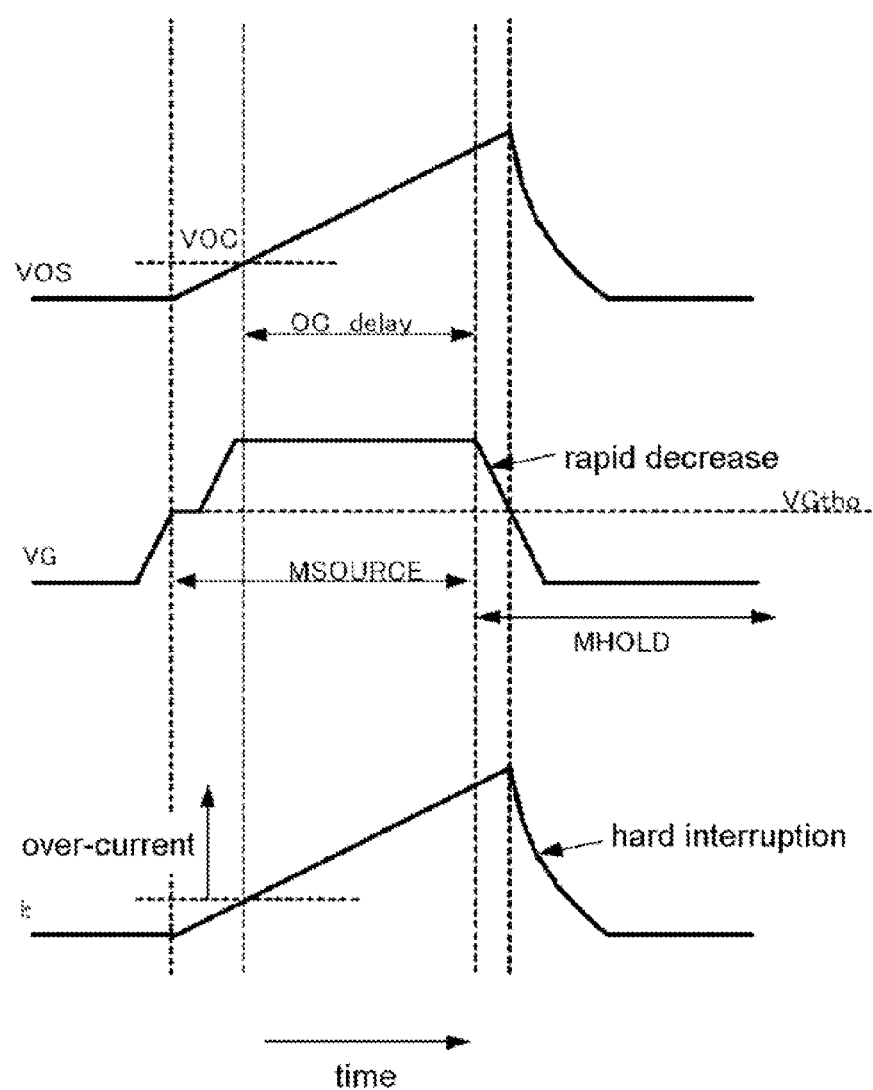
FIG. 10 shows operation waveforms in the gate driving circuit 700 of FIG. 9.
Figure 11:
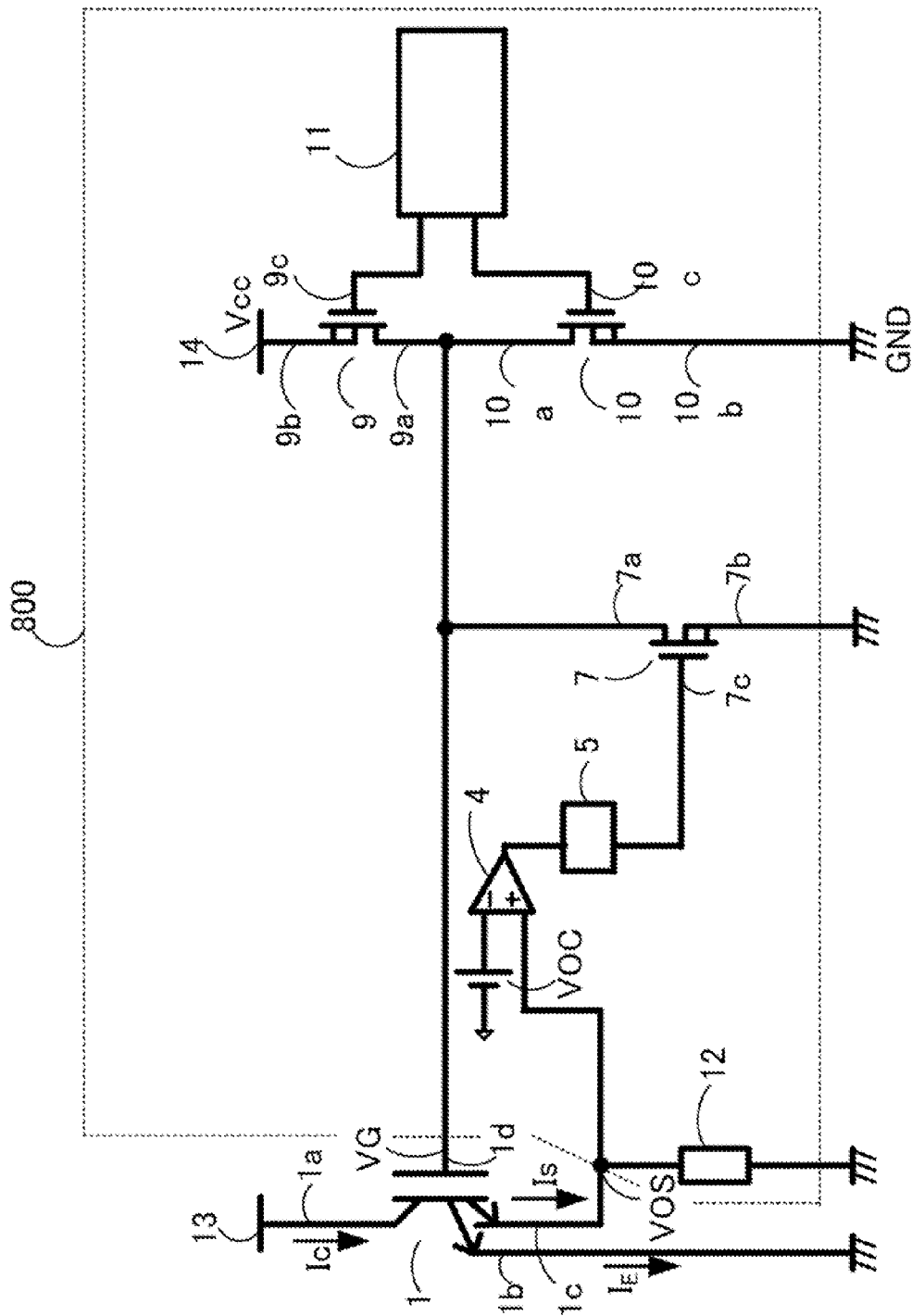
FIG. 11 is a circuit diagram showing a conventional gate driving circuit 800 for soft interruption.
Figure 12:
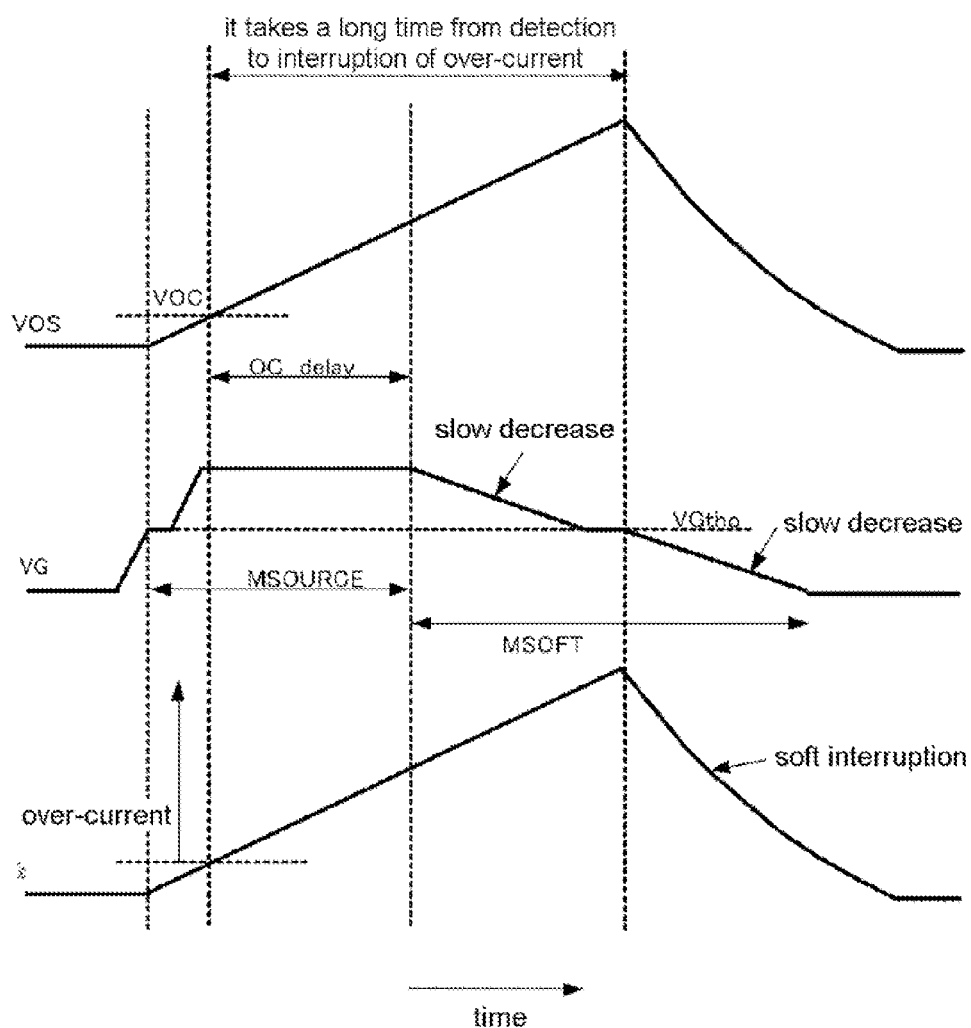
FIG. 12 shows operation waveforms in the gate driving circuit 800 of FIG. 11.

Some preferred embodiments will be described in the following with reference to the accompanying drawings. In the following description, the same symbols are given to the parts similar to those in the conventional gate driving circuits 700 and 800 shown in FIG. 9 and FIG. 11.

EXAMPLE 1

Figure 1:
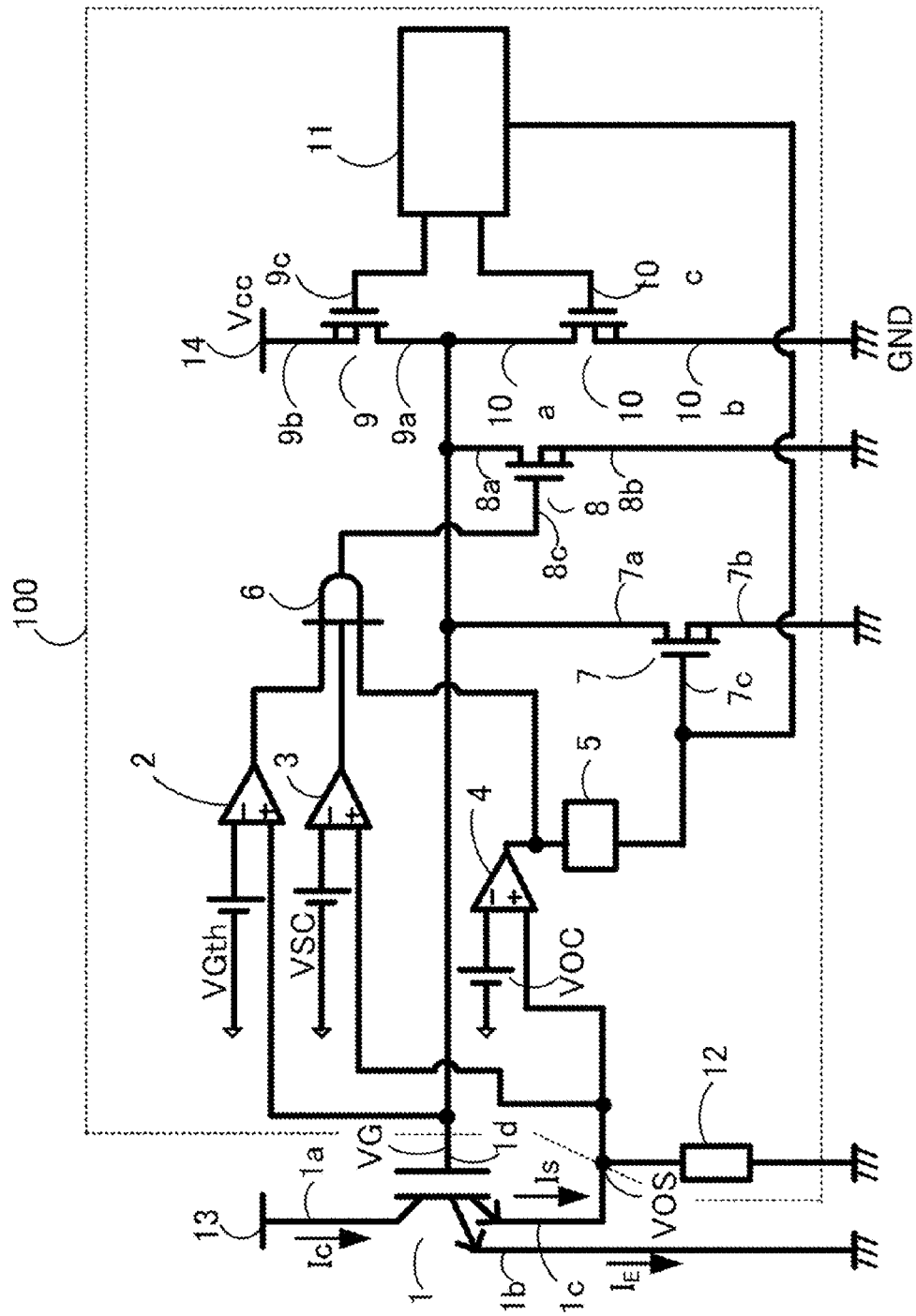
FIG. 1 is a circuit diagram of an essential part of a gate driving circuit for a power semiconductor element of a first embodiment according to the invention.

FIG. 1 is a circuit diagram of an essential part of a gate driving circuit for a power semiconductor element of a first embodiment according to the invention. A power semiconductor element is an IGBT 1 in this embodiment example. The IGBT 1 has a sense emitter 1c for detecting the main current, which is a collector current Ic. The region encircled by the dotted lines in FIG. 1 is the gate driving circuit 100.

A collector 1a of the IGBT 1 is connected to a high potential side 13 of a main power supply, and an emitter 1b is connected to the GND, which is a low potential side of the main power supply. A sense emitter is connected to the GND through a sense resistor 12. An emitter current $I_E$ is the main current flowing in the emitter 1b. VOS is a voltage generated by a sense current Is flowing through the sense resistor 12 to the GND. The collector current Ic in the IGBT 1 is divided into the emitter current $I_E$ and the sense current Is. The magnitude of the sense current Is is proportional to the emitter current $I_E$ and from 1/(several tens of thousands) to 1/(several hundred). VG is a gate voltage of the IGBT 1.

The gate voltage monitoring circuit 2 is a comparator that compares the gate voltage VG of the IGBT 1 with a predetermined threshold voltage VGth, which is a pseudo-threshold voltage, and outputs a logical high signal when the gate voltage VG exceeds the threshold voltage VGth. The threshold voltage VGth is set at a value higher than the gate threshold voltage VGtho (7 V, for example) of the IGBT 1 itself at which the IGBT 1 actually turns ON. Consequently, the IGBT 1 continues to be in the ON state at a gate voltage VG between the VGtho and the VGth. In other words, the gate voltage monitoring circuit 2 is necessary to turn the MSINK 8, which will be described afterwards, into the OFF state during the period when the IGBT 1 is certainly in the ON state, isolating the MSINK 8 from the gate of the IGBT 1. If the gate voltage monitoring circuit 2 is not provided, the MSINK 8 is not isolated from the gate of the IGBT 1, resulting in hard interruption of the IGBT 1.

The short circuit detection circuit 3 is a comparator that compares the VOS with a short circuit protection threshold value VSC and outputs a logical high signal when the VOS exceeds the short circuit protection threshold value VSC.

The overcurrent detection circuit 4 is a comparator that compares the VOS with an overcurrent protection threshold value VOS and outputs a logical high signal when the VOS exceeds the overcurrent protection threshold value VOC.

The delay circuit 5 is provided for the purpose of avoiding an undesirable effect of temporary operation of the overcurrent detection circuit 4 due to noise or the like. An output signal from the delay circuit 5 is outputted at a time delayed by a predetermined period for example 4 μs, from the moment of signal delivery from the overcurrent detector circuit 4.

The short circuit protection threshold value VSC and the overcurrent protection threshold value VOC are set in a relationship VSC>VOC.

The logic circuit 6 is an AND circuit and outputs an output signal, a logical high signal, when output signals are outputted from all of the gate voltage monitoring circuit 2, the short circuit detection circuit 3, and the overcurrent detection circuit 4.

The MSOFT 7, which is an n-channel MOSFET, is provided for soft interrupting the IGBT 1. The gate 7c of the MSOFT 7 is connected to the output terminal of the delay circuit 5; the source 7b is connected to the GND; and the drain 7a is connected to the gate 1d of the IGBT 1. The output signal from the delay circuit 5 is set to output during the period until the IGBT 1 completely turns OFF.

The MSINK 8, which is an n-channel MOSFET, accelerates lowering of the gate voltage VG of the IGBT 1 and shifts earlier the time at which the collector current Ic transfer to a decreasing process. The gate 8c of the MSINK 8 is connected to the output terminal of the logic circuit 6; the source 8b is connected to the GND; and the drain 8a is connected to the gate 1d of the IGBT 1. The output signal from the logic circuit 6 holds the MSINK 8 in the ON state.

The gate 9c of the MSOURCE 9, which is a p-channel MOSFET, is connected to the predriving circuit 11; the source 9b is connected to the high potential side 14 of the control power supply; and the drain 9a is connected to the gate 1d of the IGBT 1. The MSOURCE 9 turns ON when the predriving circuit 11 outputs an ON signal for the IGBT 1 turning the IGBT 1 ON. The MSOURCE 9 is turned OFF in the case the IGBT 1 is turned OFF in the normal condition, and in the case a signal is inputted indicating an abnormal condition such as load short circuit or overcurrent.

The gate 10c of the MHOLD 10, which is an n-channel MOSFET, is connected to the predriving circuit 11; the source 10b is connected to the GND; and the drain 10a is connected to the gate 1d of the IGBT 1. The MHOLD 10 turns ON when the predriving circuit 11 outputs a normal OFF signal that does not indicate any abnormal condition such as overcurrent in the IGBT 1 and makes the IGBT 1 turn OFF. If a signal indicates some abnormal condition, the MHOLD 10 stays in the OFF state, in preference for operation of a circuit for protecting the IGBT 1 against an abnormal condition as described afterwards.

The ON resistances of the MSOFT 7, the MSINK 8, and the MHOLD 10 are set such that the ON resistance of the MSOFT 7 is the largest, the ON resistance of the MSINK 8 the next, and the ON resistance of the MHOLD the smallest.

The setting of ON resistances performs protection operation avoiding hard interruption as described in the following.

Figure 2:
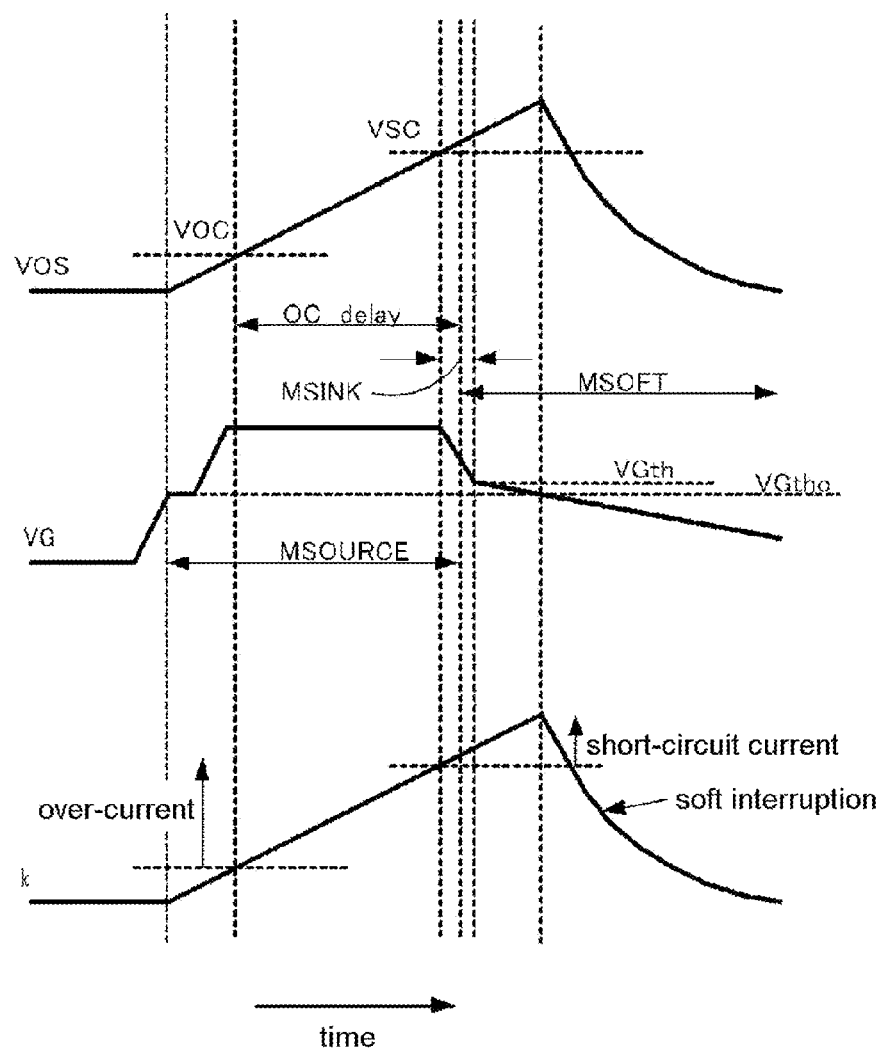
FIG. 2 shows operation waveforms in the gate driving circuit 100 of FIG. 1.

FIG. 2 shows operation waveforms in the gate driving circuit 100 of FIG. 1. Operation of the gate driving circuit 100 is described referring to FIG. 2. When a signal at the GND level is outputted from the predriving circuit 11, the MSOURCE 9 turns ON and a positive voltage is applied to the gate 1d of the IGBT 1. When the gate voltage VG reaches the gate threshold value of the element itself VGtho, the IGBT 1 turns ON. Upon transition of the IGBT 1 to the ON state, the collector current $I_C$ starts to flow and the gate voltage VG becomes a constant voltage at the moment of the value VGtho. After the period of the constant voltage, the gate voltage VG increases again and reaches a control power supply voltage Vcc to stay at this voltage. The emitter current $I_E$ flows through the emitter 1b of the IGBT 1 and the sense current Is flows through the sense emitter 1c. The sense current Is flows through the sense resistor 12 to the GND. The sense current Is generates the voltage VOS at the sense resistor 12. The sense current Is is proportional to the collector current Ic and at a value from 1/(several tens of thousands) to 1/(several hundred) as mentioned previously.

When the emitter current $I_E$ reaches a level of overcurrent judgment, the voltage VOS reaches the reference voltage VOC. At the time the voltage VOS arrives at the voltage VOC, a judgment of overcurrent is made and the overcurrent detection circuit 4 delivers an output signal to the delay circuit 5 to start operation of the delay circuit 5.

The delay circuit 5 outputs a logical high output signal after a predetermined period of time (for example 4 μs) from the start of operation of the delay circuit 5. The collector current Ic continues to increase during the period towards the output of this output signal from the delay circuit 5. If the delay circuit 5 outputs the output signal before the collector current Ic reaches a short circuit current level, although this case is different from the case illustrated in FIG. 2, the MSOFT 7 turns ON. The case of FIG. 2 is described afterwards. At the same time, the predriving circuit 11 that is connected to the delay circuit 5 outputs a signal to turn the MSOURCE 9 OFF. With the turn OFF of the MSOURCE 9, the current flowing to the MSOFT 7 from the high potential side 14 of the control power supply stops. Thus, solely the drawing out current of the charges accumulated on the gate of the IGBT 1 flows through the MSOFT 7. As a consequence of a large ON resistance of the MSOFT 7, the gate voltage VG decreases slowly and the collector current Ic turns to a decreasing process at the moment the VG reaches the VGtho. Since the gate voltage VG decreases slowly, the collector current IC slowly decreases as well. Therefore, the oscillation superimposed on the waveform of collector-emitter voltage is mitigated, suppressing noise generation.

After that, when the MHOLD 10 turns ON receiving a signal from the predriving circuit 11, the IGBT 1 becomes complete OFF state.

If the collector current Ic reaches the short circuit current level in the period of time from the start of operation of the delay circuit 5 to the output of the output signal from the delay circuit, which is just the case illustrated in FIG. 2, the voltage VOS reaches the voltage VSC and the logic circuit 6 delivers a signal to the MSINK 8 to turn the MSINK 8 ON.

Since the ON resistance of the MSINK 8 is small, the gate voltage VG decreases rapidly. However, short circuit current, the collector current Ic, continues to increase flowing in the IGBT 1. When the delay period of time of the delay circuit 5 is over and an output signal is delivered from the delay circuit 5 to the gate 7c of the MSOFT 7, the MSOFT turns ON and the charges accumulated on the gate 1d are drawn out through both of the MSINK 8 and the MSOFT 7. At the moment the gate voltage VG reaches the voltage VGth, the MSINK 8 turns into an OFF state. Consequently, the charges accumulated on the gate 1*d* are drawn solely through the MSOFT 7, and thus, the decreasing speed of the gate voltage VG slows down. At the moment the gate voltage VG reaches the voltage VGtho, the collector current Ic turns into a decreasing process. Since the gate voltage VG slowly decreases, the collector current Ic also decreases slowly, performing soft interruption of the IGBT 1. Therefore, the oscillation superimposed on the collector-emitter voltage waveform is mitigated and noise generation is suppressed.

After that, when the MHOLD 10 turns ON receiving a signal from the predriving circuit 11, the IGBT 1 becomes completely in the OFF state. The MSOURCE 9 and the MHOLD 10 compose an output stage circuit for driving the IGBT 1.

Operation of the gate voltage monitoring circuit 2 is further described in the following. The gate voltage monitoring circuit 2 delivers an output signal to the logic circuit 6 in the condition of the gate voltage VG>VGth. Normally, the IGBT 1 is in operation in a condition of the gate voltage VG higher than the voltage VGth. When a short circuit current flows, the logic circuit 6 delivers a signal to the gate of the MSINK 8 to turn the MSINK 8 ON, rapidly lowering the gate voltage VG.

However, the MSINK 8 turns OFF when the gate voltage VG has lowered to the voltage VGth and is isolated from the IGBT 1 during a short circuit current is yet flowing in the IGBT 1. After this time, the decrease of the gate voltage VG is carried out by the MSOFT 7 and the gate voltage VG decreases slowly. When the gate voltage VG reaches the voltage VGtho, the short circuit current turns into a decreasing stage. Because the gate voltage VG decreases slowly, the IGBT 1 is shut down in a soft interruption process.

The gate driving circuit of the present invention allows soft interruption of an overcurrent and a short circuit current in the IGBT 1. Therefore, device break down is surely avoided and noise generation is steadily suppressed.

The following describes a gate driving circuit that allows fast falling down of the gate voltage VG as in the Example 1 even in the case accompanying oscillation of an overcurrent or a short circuit current.

EXAMPLE 2

Figure 3:
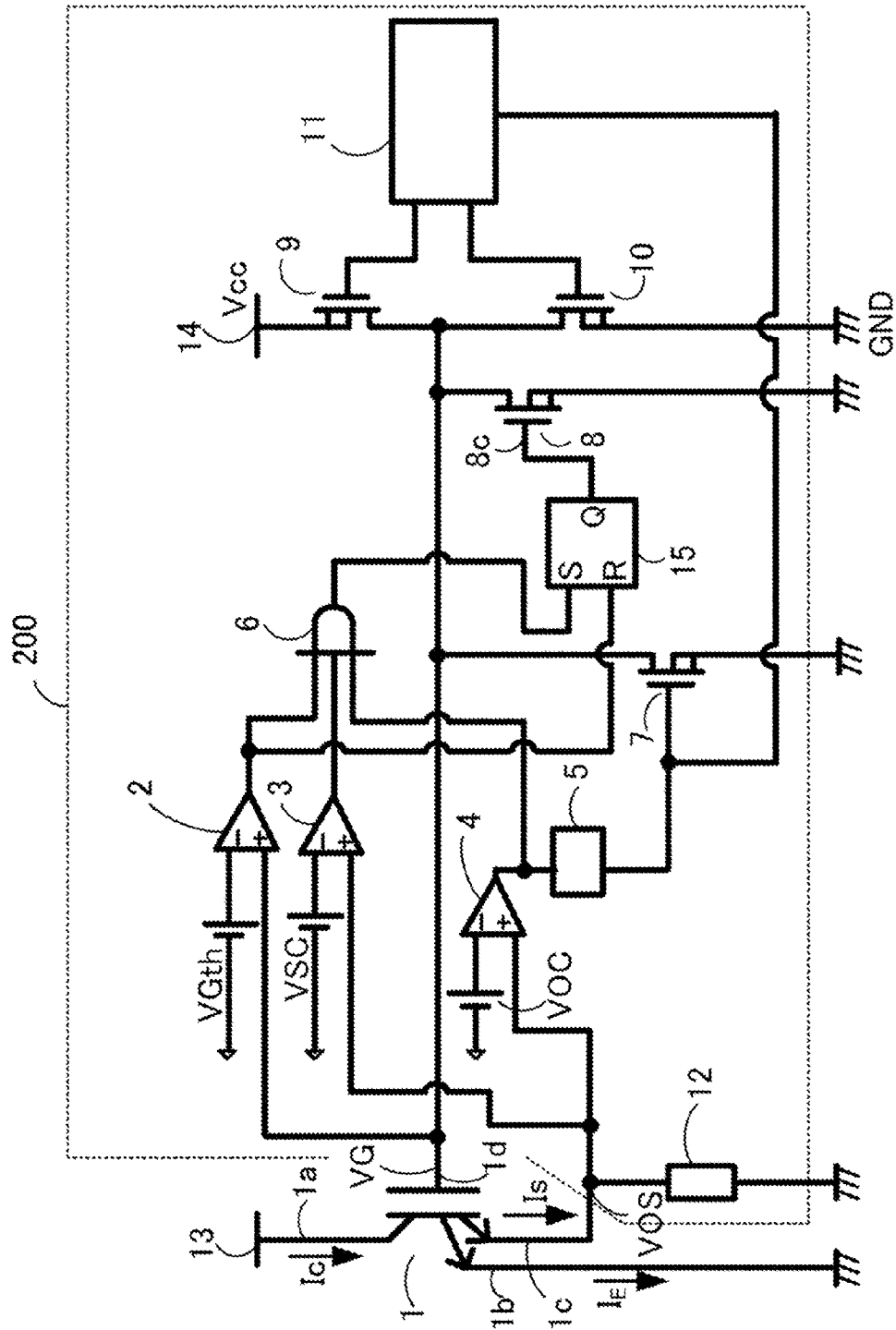
FIG. 3 is a circuit diagram of an essential part of a gate driving circuit for a power semiconductor element of a second embodiment according to the invention.

FIG. 3 is a circuit diagram of an essential part of a gate driving circuit for a power semiconductor element of Example 2 according to the present invention.

This gate driving circuit 200 is different from the gate driving circuit 100 in that a one-shot circuit 15 is additionally provided in the gate driving circuit 200. The S terminal of the one-shot circuit 15 is connected to the output terminal of the logic circuit 6; the R terminal is connected to the output terminal of the gate voltage monitoring circuit 2; and the Q terminal is connected to the gate 8*c* of the MSINK 8. The one-shot circuit 15 is composed of a flip-flop circuit that performs a set function and a reset function.

Owing to provision of the one-shot circuit 15, the gate driving circuit 200 allows fast falling down of the gate voltage VG as in the Example 1 even in the case accompanying oscillation of a short circuit current.

Operation waveforms of the gate driving circuit 200 are as same as those in FIG. 2. Even in the case of oscillation in short circuit current, the one-shot circuit 15 starts to operate at the moment when the voltage VOS reaches the voltage VSC in the first oscillation to turn the MSINK 8 to the ON state, and operation thereafter is similar to the case of FIG. 1. Consequently, falling down of the gate voltage VG does not delay even in the case accompanying oscillation in short circuit current.

Provision of the one-shot circuit 15 allows soft interruption of the IGBT 1 as in the Example 1 even in the case accompanying oscillation of a short circuit current in the IGBT 1. Therefore, device break down is surely avoided and noise generation is steadily suppressed.

EXAMPLE 3

Figure 4:
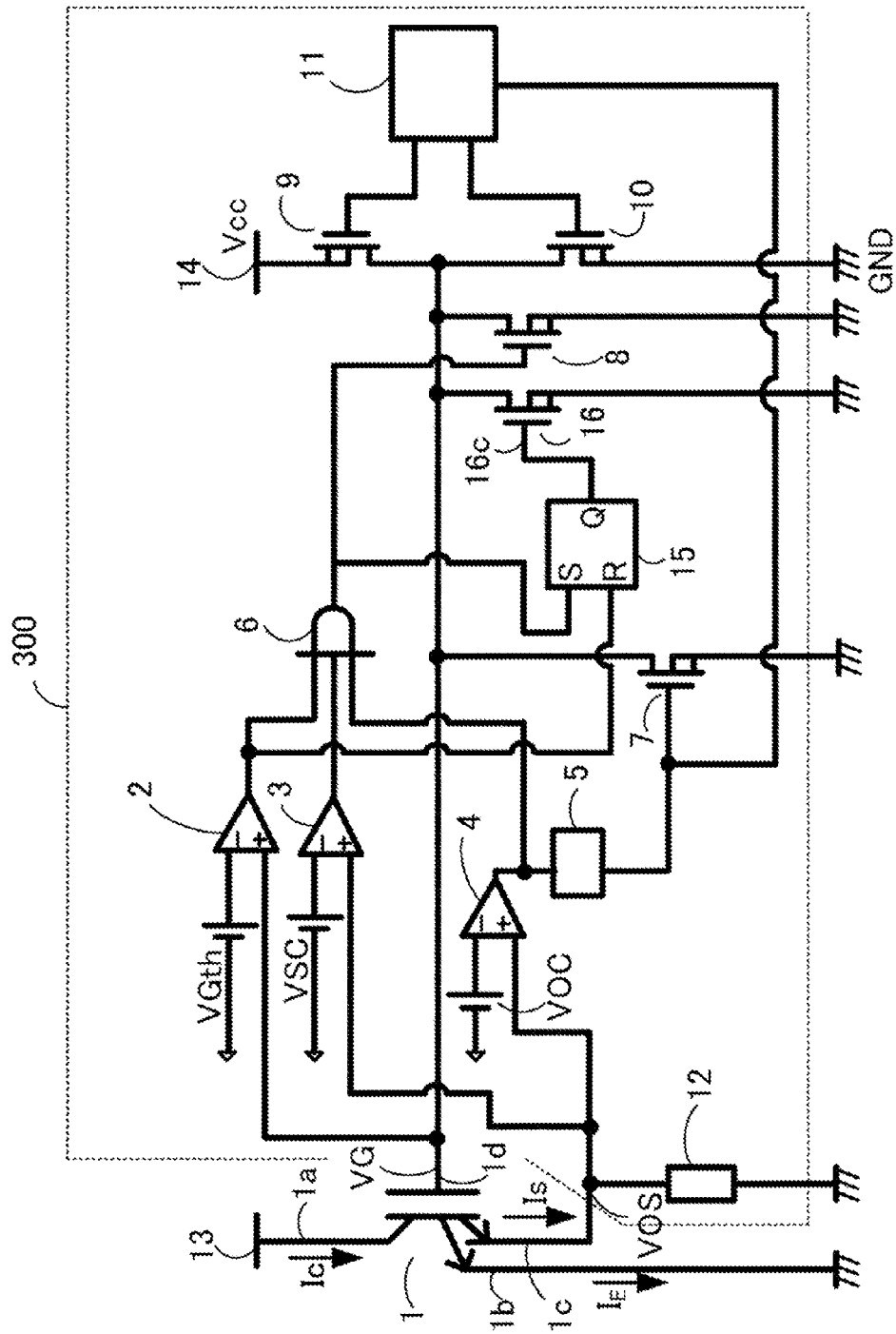
FIG. 4 is a circuit diagram of an essential part of a gate driving circuit for a power semiconductor element of a third embodiment according to the invention.

FIG. 4 is a circuit diagram of an essential part of a gate driving circuit for a power semiconductor element of Example 3 according to the present invention.

This gate driving circuit 300 is different from the gate driving circuit 100 of FIG. 1 in that a second MSINK 16 is provided in addition to the one-shot circuit 15 in FIG. 3. Since the charges on the gate 1*d* of the IGBT 1 are drawn out also through the second MSINK 16, the gate voltage VG decreases faster than the one in the gate driving circuit 100 of FIG. 1 and the collector current Ic becomes into a decreasing process earlier. Consequently, device breakdown due to overcurrent or short circuit is more surely avoided.

Falling down of the gate voltage VG does not delay even in the case accompanying oscillation in short circuit current as in the gate driving circuit 200 of FIG. 3.

Figure 5:
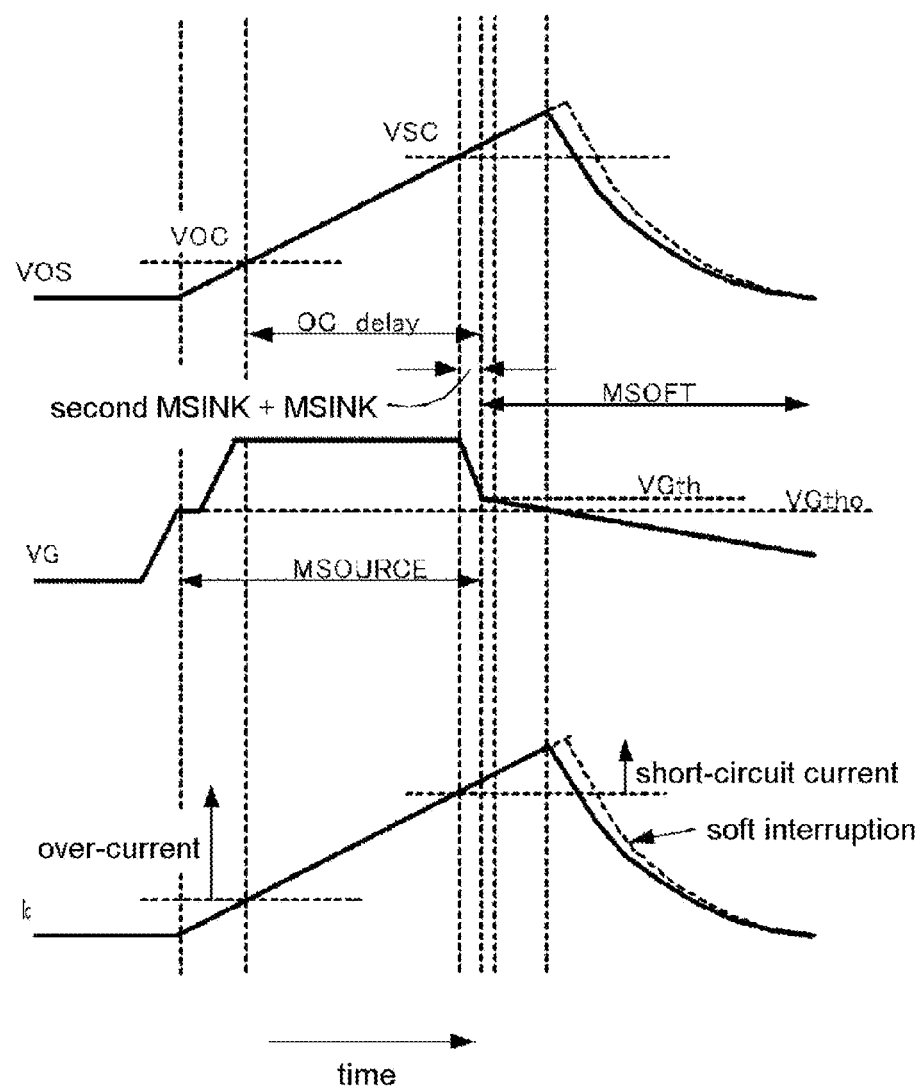
FIG. 5 shows operation waveforms in the gate driving circuit 300 of FIG. 4.

FIG. 5 shows operation waveforms in the gate driving circuit 300 of FIG. 4. The dotted lines in FIG. 5 show the waveforms in FIG. 2. As shown in FIG. 5, the time of transition of the collector current Ic into a decreasing stage is shifted earlier than the case in FIG. 2.

EXAMPLE 4

Figure 6:
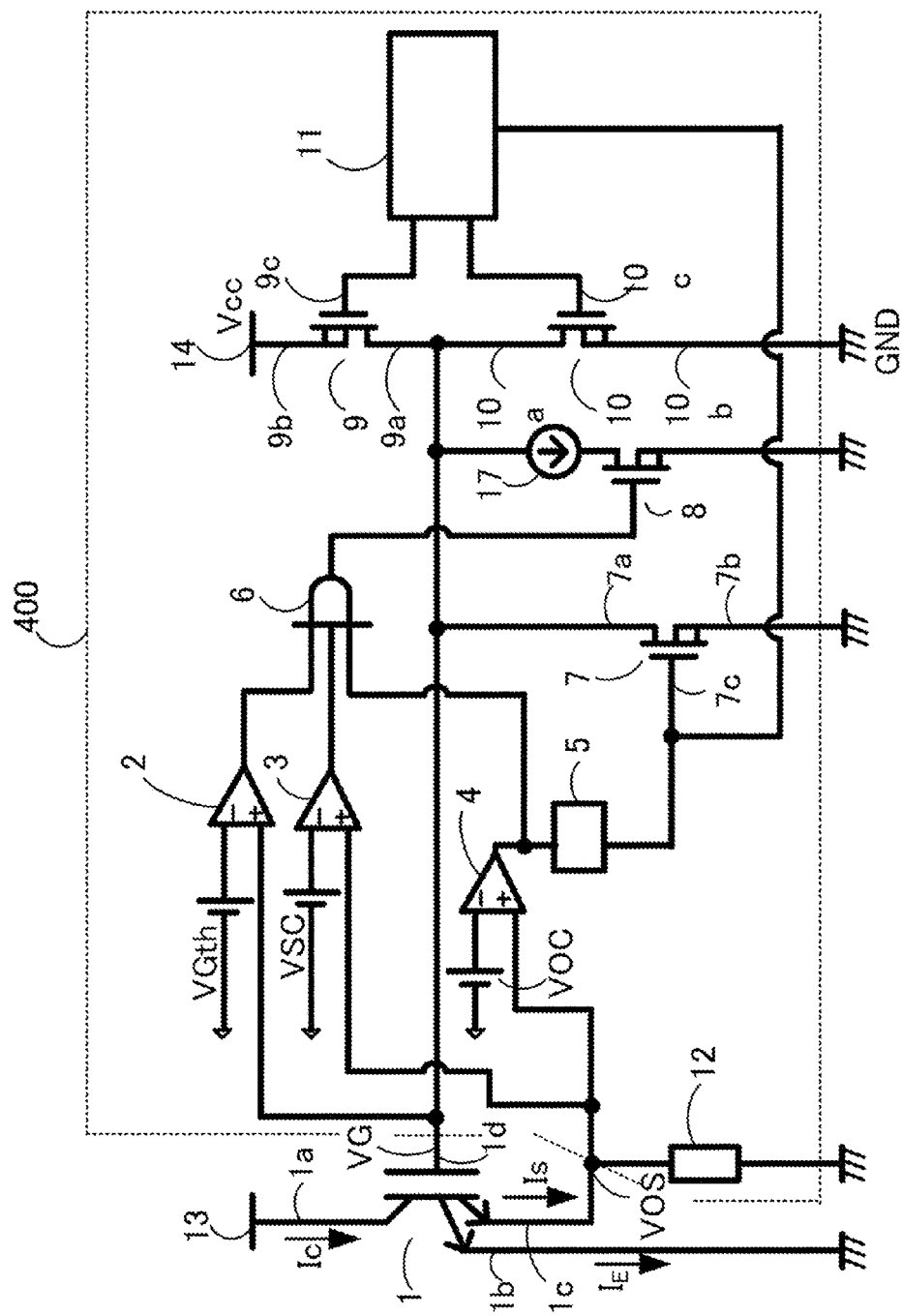
FIG. 6 is a circuit diagram of an essential part of a gate driving circuit for a power semiconductor element of a fourth embodiment according to the invention.

FIG. 6 is a circuit diagram of an essential part of a gate driving circuit for a power semiconductor element of Example 4 according to the present invention.

This gate driving circuit 400 is different from the gate driving circuit 100 of FIG. 1 in that a constant current source 17 is connected between the drain 8*a* of the MSINK 8 and the gate 1*d* of the IGBT 1.

Provision of the constant current source 17 connected to the gate 1*d* allows rapid drawing out of the charges accumulated on the gate 1*d* resulting in earlier transition to the decreasing stage of the collector current Ic. Consequently, device breakdown due to overcurrent or short circuit current is more surely avoided.

EXAMPLE 5

Figure 7:
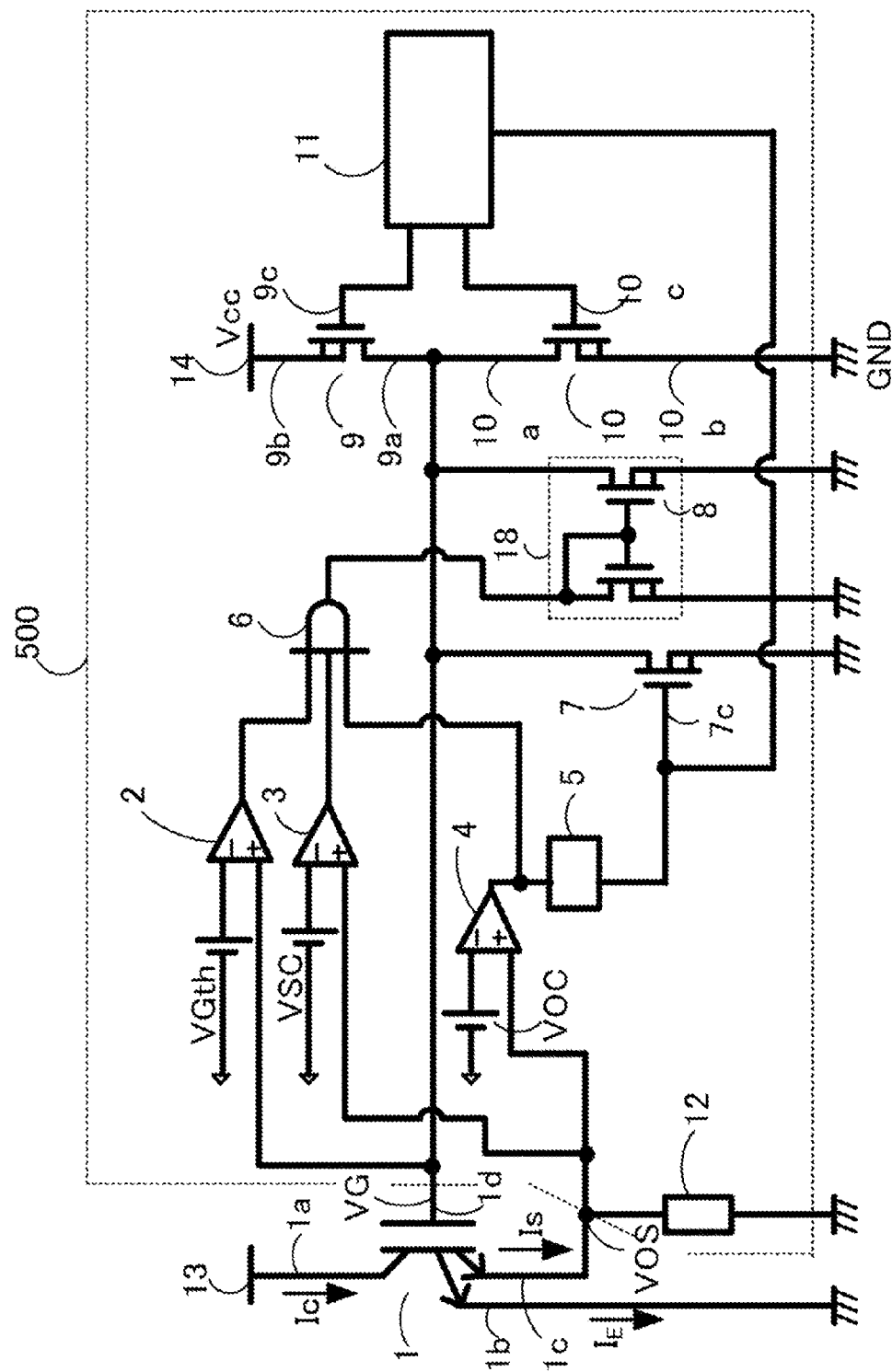
FIG. 7 is a circuit diagram of an essential part of a gate driving circuit for a power semiconductor element of a fifth embodiment according to the invention.

FIG. 7 is a circuit diagram of an essential part of a gate driving circuit for a power semiconductor element of Example 5 according to the present invention.

This gate driving circuit 500 is different from the gate driving circuit 400 of FIG. 6 in that the constant current source 17 is replaced by a current mirror circuit 18 in the gate driving circuit 500. The MSINK 8 is a component of the mirror circuit 18. This gate driving circuit 500 also has the same effects as those in the gate driving circuit of FIG. 6.

EXAMPLE 6

Figure 8:
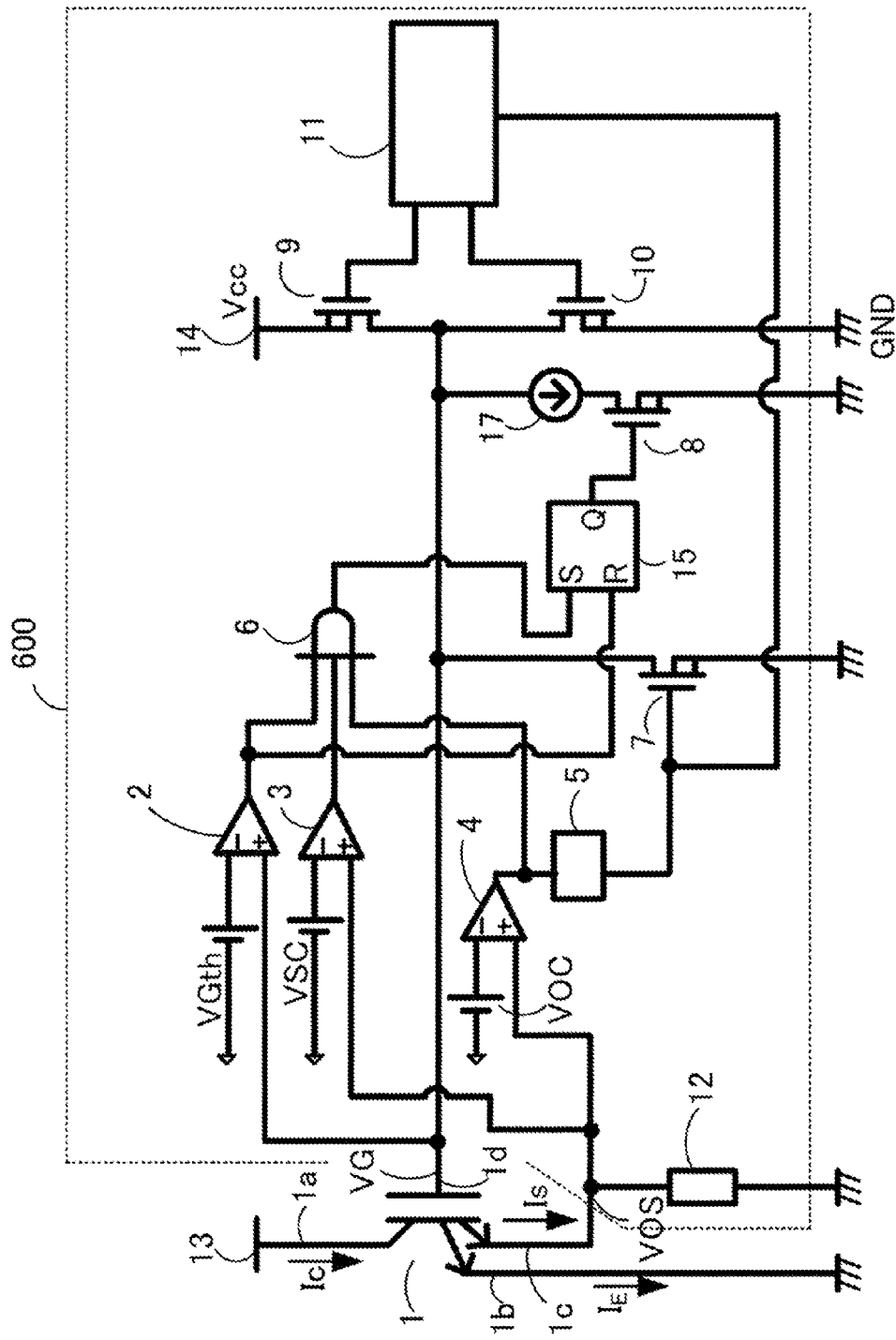
FIG. 8 is a circuit diagram of an essential part of a gate driving circuit for a power semiconductor element of a sixth embodiment according to the invention.

FIG. 8 is a circuit diagram of an essential part of a gate driving circuit for a power semiconductor element of Example 6 according to the present invention.

This gate driving circuit 600 is different from the gate driving circuit 200 of FIG. 3 in that a constant current source 17 connected between the drain 8a of the MSINK 8 and the gate 1d of the IGBT 1 is provided.

Provision of the constant current source 17 connected to the gate 1d allows rapid drawing out of the charges accumulated on the gate 1d resulting in earlier transition to the decreasing stage of the collector current Ic. Consequently, device breakdown due to overcurrent or short circuit current is more surely avoided.

The gate driving circuits 100, 200, 300, 400, 500, and 600 are placed separately from a package containing the IGBT 1 in some cases. However, an intelligent power module (IPM) can be constructed by installing the gate driving circuit within the package containing the IGBT.

This application is based on, and claims priority to, Japanese Patent Application No. 2010-160888, filed on Jul. 15, 2010, the contents of which are incorporated herein by reference.

What is claimed is:

1. A gate driving circuit for a power semiconductor element comprising:
    a sense resistor in which a sense current proportional to a main current in a switching element flows;
    an overcurrent detection circuit and a short circuit detection circuit that each receive a sense voltage generated in the sense resistor;
    a gate voltage monitoring circuit that receives a gate voltage of the switching element;
    a delay circuit that receives an output signal from the overcurrent detection circuit;
    a logic circuit that receives output signals of the overcurrent detection circuit, of the short circuit detection circuit, and of the gate voltage monitoring circuit;
    a first semiconductor element that receives an output signal from the delay circuit;
    a second semiconductor element that receives an output signal from the logic circuit;
    a predriving circuit that receives an output signal from the delay circuit and drives the switching element; and
    an output stage circuit that receives an output signal from the predriving circuit and delivers a gate signal to the switching element;
    wherein the overcurrent detection circuit outputs a first output signal when the sense voltage exceeds a first reference voltage indicating an overcurrent level, the short circuit detection circuit outputs a second output signal when the sense voltage exceeds a second reference voltage indicating a short circuit current level, and the gate voltage monitoring circuit outputs a third output signal when the gate voltage of the switching element exceeds a pseudo-threshold voltage that is higher than a gate threshold voltage; and
    wherein the first semiconductor element is turned ON while the second semiconductor element is OFF, and the second semiconductor element is then turned ON when the logic circuit receives the first, second and third outputs.

2. The gate driving circuit for a power semiconductor element according to claim 1, wherein the first semiconductor element is an n-channel first MOSFET, and the second semiconductor element is an n-channel second MOSFET having an ON resistance smaller than that of the first semiconductor element.

3. The gate driving circuit for a power semiconductor element according to claim 1, wherein the gate voltage of the switching element decreases rapidly caused by turning ON of the second semiconductor element, thereby shifting a time for the main current in the switching element to turn into a decreasing process to an earlier time; and the gate voltage of the switching element decreases slowly caused by turning ON of the first semiconductor element, thereby performing soft interruption of the switching element.

4. A gate driving circuit for a power semiconductor element comprising:
    a sense resistor in which a sense current proportional to a main current in a switching element flows;
    an overcurrent detection circuit and a short circuit detection circuit that each receive a sense voltage generated in the sense resistor;
    a gate voltage monitoring circuit that receives a gate voltage of the switching element;
    a delay circuit that receives an output signal from the overcurrent detection circuit;
    a logic circuit that receives output signals of the overcurrent detection circuit, of the short circuit detection circuit, and of the gate voltage monitoring circuit;
    a first semiconductor element that receives an output signal from the delay circuit;
    a second semiconductor element that receives an output signal from the logic circuit;
    a predriving circuit that receives an output signal from the delay circuit and drives the switching element;
    an output stage circuit that receives an output signal from the predriving circuit and delivers a gate signal to the switching element; and
    a one-shot circuit in which an S terminal thereof is connected to an output terminal of the logic circuit, an R terminal thereof is connected to an output terminal of the gate voltage monitoring circuit, and a Q terminal thereof is connected to a gate terminal of the second semiconductor element.

5. The gate driving circuit for a power semiconductor element according to claim 4, wherein the one-shot circuit is composed of a flip-flop circuit performing a set function and a reset function.

6. The gate driving circuit for a power semiconductor element according to claim 1, further comprising a constant current source inserted between a drain of the second semiconductor element and a gate of the switching element.

7. A gate driving circuit for a power semiconductor element comprising:
    a sense resistor in which a sense current proportional to a main current in a switching element flows;
    an overcurrent detection circuit and a short circuit detection circuit that each receive a sense voltage generated in the sense resistor;
    a gate voltage monitoring circuit that receives a gate voltage of the switching element;
    a delay circuit that receives an output signal from the overcurrent detection circuit;
    a logic circuit that receives output signals of the overcurrent detection circuit, of the short circuit detection circuit, and of the gate voltage monitoring circuit;
    a first semiconductor element that receives an output signal from the delay circuit;
    a second semiconductor element that receives an output signal from the logic circuit;
    a predriving circuit that receives an output signal from the delay circuit and drives the switching element;
    an output stage circuit that receives an output signal from the predriving circuit and delivers a gate signal to the switching element; and
    a current mirror circuit in place of the second semiconductor element, the current mirror circuit being inserted between the gate terminal of the switching element and a GND terminal and comprising the second semiconductor element as a component of the current mirror circuit.

* * * * *